United States Patent
Takakura

(10) Patent No.: US 9,173,301 B2
(45) Date of Patent: Oct. 27, 2015

(54) PRINTED CIRCUIT BOARD AND METHOD OF MANUFACTURING SAME

(71) Applicant: Nitto Denko Corporation, Osaka (JP)

(72) Inventor: Hayato Takakura, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/332,486

(22) Filed: Jul. 16, 2014

(65) Prior Publication Data

US 2015/0027752 A1 Jan. 29, 2015

(30) Foreign Application Priority Data

Jul. 25, 2013 (JP) ................ 2013-154151

(51) Int. Cl.
| | |
|---|---|
| H05K 1/09 | (2006.01) |
| H05K 1/11 | (2006.01) |
| H05K 3/24 | (2006.01) |
| H05K 3/00 | (2006.01) |
| H05K 1/03 | (2006.01) |
| H05K 1/05 | (2006.01) |
| H05K 3/28 | (2006.01) |

(52) U.S. Cl.
CPC ............. *H05K 3/243* (2013.01); *H05K 1/118* (2013.01); *H05K 1/0393* (2013.01); *H05K 1/056* (2013.01); *H05K 1/117* (2013.01); *H05K 3/002* (2013.01); *H05K 3/244* (2013.01); *H05K 3/287* (2013.01); *H05K 2203/0323* (2013.01); *H05K 2203/0514* (2013.01); *H05K 2203/1184* (2013.01)

(58) Field of Classification Search
CPC ....... H05K 1/118; H05K 3/243; H05K 3/002; H05K 1/0393; H05K 1/056; H05K 1/117; H05K 2203/1184; H05K 3/244; H05K 3/287; H05K 2203/0323; H05K 2203/0514
USPC .................... 174/251, 255, 257, 267
See application file for complete search history.

(56) References Cited

U.S. PATENT DOCUMENTS

| | | | |
|---|---|---|---|
| 2005/0122627 A1* | 6/2005 | Kanagawa et al. | 360/245.9 |
| 2008/0102609 A1* | 5/2008 | Ishii et al. | 438/479 |
| 2008/0217048 A1* | 9/2008 | Kamei et al. | 174/258 |
| 2009/0151994 A1* | 6/2009 | Ohsawa et al. | 174/261 |
| 2012/0067626 A1* | 3/2012 | Mizutani | 174/255 |
| 2012/0087041 A1* | 4/2012 | Ohsawa | 360/234.5 |
| 2013/0105208 A1* | 5/2013 | Higuchi et al. | 174/258 |
| 2013/0319748 A1* | 12/2013 | Ishii et al. | 174/262 |

FOREIGN PATENT DOCUMENTS

| | | |
|---|---|---|
| JP | 2011-096721 A | 5/2011 |
| JP | 2013-045482 A | 3/2013 |

* cited by examiner

*Primary Examiner* — Hoa C Nguyen
(74) *Attorney, Agent, or Firm* — Panitch Schwarze Belisario & Nadel LLP

(57) ABSTRACT

A wiring cover layer is formed on a base insulating layer with a conductor trace sandwiched therebetween. A cover insulating layer is formed on the base insulating layer to cover the wiring cover layer. A terminal cover layer is formed to cover a terminal portion of the conductor trace. A projection of the wiring cover layer projects from an upper surface of the wiring portion to a position above the terminal portion. An end surface of the projection is positioned inward from an end of the cover insulating layer. An insert portion of the terminal cover layer is formed between an upper surface of the terminal portion and a lower surface of the end of the cover insulating layer. A projection of the terminal cover layer is formed between the upper surface of the terminal portion and a lower surface of the projection of the wiring cover layer.

11 Claims, 5 Drawing Sheets

PRINTED CIRCUIT BOARD AND METHOD OF MANUFACTURING SAME

BACKGROUND OF THE INVENTION

1. Field of the Invention

The present invention relates to a printed circuit board and a method of manufacturing the printed circuit board.

2. Description of Related Art

Conventionally, a printed circuit board is used in various types of electric equipment and electronic equipment. In JP 2013-45482 A, a printed circuit board (a substrate for suspension) used for positioning a magnetic head in a magnetic disc device is shown.

In a substrate for suspension of JP 2013-45482 A, a metal support substrate, an insulating layer, a wiring layer, a wiring cover layer and a cover layer are laminated in this order. The wiring layer has a thick portion and a thin portion (a terminal portion). The wiring cover layer and the cover layer are sequentially formed on the thick portion of the wiring layer. The terminal portion of the wiring layer projects outward from the cover layer. A terminal plating portion is formed to be thick to cover a surface of the terminal portion and an end of the cover layer.

BRIEF SUMMARY OF THE INVENTION

In the substrate for suspension of JP 2013-45482 A, the terminal plating portion is formed to be thick on purpose, whereby the infiltration of outside air and a liquid to the wiring cover layer, and an occurrence of foreign matters (particles) derived from the cover layer are inhibited. In recent years, however, fine pitching of the printed circuit board has been developed, and it is required to reduce the thickness of a terminal cover layer such as a terminal plating portion.

An object of the present invention is to provide a printed circuit board in which a corrosion of a terminal portion can be prevented without an increase in a thickness of a terminal cover layer and a method of manufacturing the printed circuit board.

(1) According to one aspect of the present invention, a printed circuit board includes a base insulating layer, a conductor trace that is formed on the base insulating layer and has a terminal portion and a wiring portion, a wiring cover layer formed on the wiring portion of the conductor trace, a cover insulating layer formed on the base insulating layer to cover the wiring cover layer, and a terminal cover layer formed to cover the terminal portion of the conductor trace, wherein the terminal portion has a thickness smaller than a thickness of the wiring portion, and a difference between the thickness of the terminal portion and the thickness of the wiring portion is not more than 2 μm, the wiring cover layer has a first projection that projects from an upper surface of the wiring portion to a position above the terminal portion, and an end surface of the first projection is positioned at an inner side than an end of the cover insulating layer, the terminal cover layer has an insert portion formed between an upper surface of the terminal portion and a lower surface of the end of the cover insulating layer, and a second projection formed between the upper surface of the terminal portion and a lower surface of the first projection, and the terminal cover layer is formed such that an upper surface of the insert portion and the lower surface of the end of the cover insulating layer come into contact with each other, an end surface of the insert portion and the end surface of the first projection come into contact with each other and an upper surface of the second projection and the lower surface of the first projection come into contact with each other.

In this printed circuit board, the conductor trace is formed on the base insulating layer. The wiring cover layer is formed on the wiring portion of the conductor trace. The cover insulating layer is formed on the base insulating layer to cover the wiring cover layer. The terminal cover layer is formed to cover the terminal portion of the conductor trace. The terminal portion has a thickness smaller than the thickness of the wiring portion, and the difference between the thickness of the terminal portion and the thickness of the wiring portion is not more than 2 μm.

The first projection of the wiring cover layer projects from the upper surface of the wiring portion to a position above the terminal portion. The end surface of the first projection is positioned at an inner side than the end of the cover insulating layer. The insert portion of the terminal cover layer is formed between the upper surface of the terminal portion and the lower surface of the end of the cover insulating layer. The second projection of the terminal cover layer is formed between the upper surface of the terminal portion and the lower surface of the first projection. The upper surface of the insert portion and the lower surface of the end of the cover insulating layer come into contact with each other, the end surface of the insert portion and the end surface of the first projection come into contact with each other and the upper surface of the second projection and the lower surface of the first projection come into contact with each other.

This configuration prevents the infiltration of the chemical liquid between the upper surface of the insert portion and the lower surface of the end of the cover insulating layer even in a case in which the chemical liquid is used in the manufacturing step of the printed circuit board. Further, the chemical liquid is also prevented from infiltrating between the end surface of the insert portion and the end surface of the first projection, and between the upper surface of the second projection and the lower surface of the first projection.

Therefore, it is not necessary to increase the thickness of the terminal cover layer in order to prevent an occurrence of a residue of the chemical liquid. Thus, it is possible to prevent a corrosion of the terminal portion without increasing the thickness of the terminal cover layer.

(2) The insert portion may have a length of not more than 1 μm in a direction directed inward from the end of the cover insulating layer.

In this case, a residue of the chemical liquid below the cover insulating layer and the discoloration of the conductor trace by the chemical liquid can be efficiently prevented. Further, accumulation of moisture between the cover insulating layer and the terminal cover layer can be efficiently prevented. Thus, the long-term reliability of the printed circuit board can be improved.

(3) The second projection may have a length of not more than 1 μm in a direction directed inward from the end of the cover insulating layer. In this case, a residue of the chemical liquid below the wiring cover layer and the discoloration of the conductor trace can be efficiently prevented.

(4) A difference between the thickness of the terminal portion and the thickness of the wiring portion may not more than 1 μm. In this case, a residue of the chemical liquid below the wiring cover layer and the discoloration of the conductor trace by the chemical liquid can be efficiently prevented.

(5) The wiring cover layer may have a thickness of not less than 0.01 μm and not more than 1 μm. In this case, the migration of the wiring portion can be efficiently prevented while the thickness of the wiring cover layer is further reduced.

(6) According to another aspect of the present invention, a method of manufacturing a printed circuit board includes the steps of forming a conductor trace that has a terminal portion and a wiring portion on a base insulating layer, forming a wiring cover layer on the wiring portion of the conductor trace, forming a cover insulating layer on the base insulating layer to cover the wiring cover layer, and forming a terminal cover layer to cover the terminal portion of the conductor trace, wherein the terminal portion has a thickness smaller than a thickness of the wiring portion, and a difference between the thickness of the terminal portion and the thickness of the wiring portion is not more than 2 μm, the step of forming the wiring cover layer includes processing the wiring cover layer such that an end of the wiring cover layer projects from an upper surface of the wiring portion to a position above the terminal portion as a first projection, and an end surface of the first projection is positioned at an inner side than an end of the cover insulating layer, and the step of forming the terminal cover layer includes forming the terminal cover layer such that part of the terminal cover layer is formed between an upper surface of the terminal portion and a lower surface of an end of the cover insulating layer as an insert portion, another part of the terminal cover layer is formed between the upper surface of the terminal portion and a lower surface of the first projection as a second projection, the upper surface of the insert portion and the lower surface of the end of the cover insulating layer come into contact with each other, an end surface of the insert portion and the end surface of the first projection come into contact with each other, and an upper surface of the second projection and the lower surface of the first projection come into contact with each other.

This method of manufacturing the printed circuit board causes the conductor trace to be formed on the base insulating layer. The wiring cover layer is formed on the wiring portion of the conductor trace. The cover insulating layer is formed on the base insulating layer to cover the wiring cover layer. The terminal cover layer is formed to cover the terminal portion of the conductor trace. The terminal portion has a thickness smaller than the thickness of the wiring portion, and the difference between the thickness of the terminal portion and the thickness of the wiring portion is not more than 2 μm.

The first projection of the wiring cover layer projects from the upper surface of the wiring portion to a position above the terminal portion. The end surface of the first projection is positioned at an inner side than the end of the cover insulating layer. The insert portion of the terminal cover layer is formed between the upper surface of the terminal portion and the lower surface of the end of the cover insulating layer. The second projection of the terminal cover layer is formed between the upper surface of the terminal portion and the lower surface of the first projection. The upper surface of the insert portion and the lower surface of the end of the cover insulating layer come into contact with each other, the end surface of the insert portion and the end surface of the first projection come into contact with each other and the upper surface of the second projection and the lower surface of the first projection come into contact with each other.

This configuration prevents the infiltration of the chemical liquid between the upper surface of the insert portion and the lower surface of the end of the cover insulating layer even in a case in which the chemical liquid is used in the manufacturing step of the printed circuit board. Further, the chemical liquid is also prevented from infiltrating between the end surface of the insert portion and the end surface of the first projection, and between the upper surface of the second projection and the lower surface of the first projection.

Therefore, it is not necessary to increase the thickness of the terminal cover layer in order to prevent an occurrence of a residue of the chemical liquid. Thus, it is possible to prevent a corrosion of the terminal portion without increasing the thickness of the terminal cover layer.

(7) Processing the wiring cover layer may include forming the wiring cover layer to cover the wiring portion and the terminal portion, and removing a portion of the wiring cover layer exposed from the cover insulating layer and a portion of the wiring cover layer that overlaps with a region that has a predetermined length and extends in a direction directed inward from the end of the cover insulating layer, and reducing the thickness of the terminal portion that overlaps with a region that has a predetermined length and extends in a direction directed inward from the end of the wiring cover layer only by not more than 2 μm.

In this case, a process in which the first projection is formed at the wiring cover layer, and a process in which the thickness of the terminal portion is reduced to be smaller than the thickness of the wiring portion can be simultaneously performed by one-time etching. Thus, the printed circuit board can be efficiently manufactured.

(8) The removal of the wiring cover layer and the reduction of the thickness of the terminal portion may be performed by selective etching in which an etching rate for the terminal portion is higher than an etching rate for the wiring cover layer, or equal to the etching rate for the wiring cover layer.

In this case, it is possible to remove only a portion of the wiring cover layer that overlaps with a region that has a predetermined length and extends inward from the end of the cover insulating layer by hardly removing a portion of the wiring cover layer under the cover insulating layer. Thus, the first projection is formed at the wiring cover layer. Simultaneously, the thicknesses of a portion of the conductor trace exposed from the wiring cover layer and a portion of the conductor trace that overlaps with a region that has a predetermined length and extends inward from the end of the first projection can be reduced by only not more than 2 μm. Thus, the thickness of the terminal portion is smaller than the thickness of the wiring portion. As a result, the printed circuit board can be efficiently manufactured.

(9) The selective etching may be performed using an etchant in which a dissolution rate of a material for the terminal portion is higher than a dissolution rate of a material for the wiring cover layer, or equal to the dissolution rate of the material for the wiring cover layer. In this case, the selective etching can be easily performed.

(10) The wiring cover layer may include nickel, the wiring portion and the terminal portion may include copper and the etchant may include a nitric acid/hydrogen peroxide mixture.

In this case, the dissolution rate of the material for the terminal portion can be easily increased to be higher than the dissolution rate of the material for the wiring cover layer. Alternatively, the dissolution rate of the material for the wiring cover layer and the dissolution rate of the material for the terminal portion can be easily equalized.

(11) A copper inhibitor component that inhibits a corrosion of copper may be removed from the etchant. In this case, in the selective etching, the dissolution rate of the terminal portion can be easily increased to be higher than the dissolution rate of the wiring cover layer.

Other features, elements, characteristics, and advantages of the present invention will become more apparent from the following description of preferred embodiments of the present invention with reference to the attached drawings.

DESCRIPTION OF THE PREFERRED EMBODIMENTS

A printed circuit board and a method of manufacturing the printed circuit board according to one embodiment of the present invention will be described below with reference to diagrams. The printed circuit board of the present embodiment is used for positioning a magnetic head in a magnetic disc device, for example.

(1) Printed Circuit Board

Figure 1:
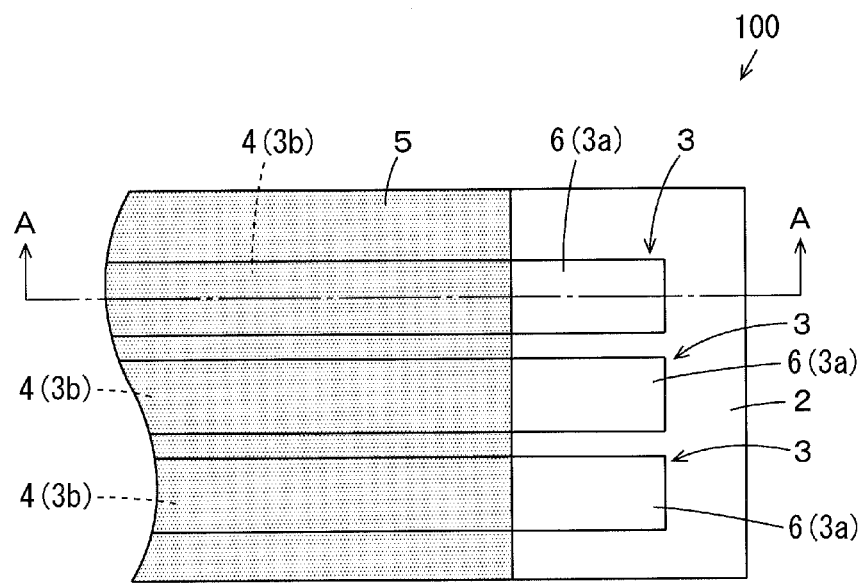
FIGS. 1(a) and 1(b) are a plan view and a cross sectional view of a printed circuit board according to the present embodiment.
Figure 1:
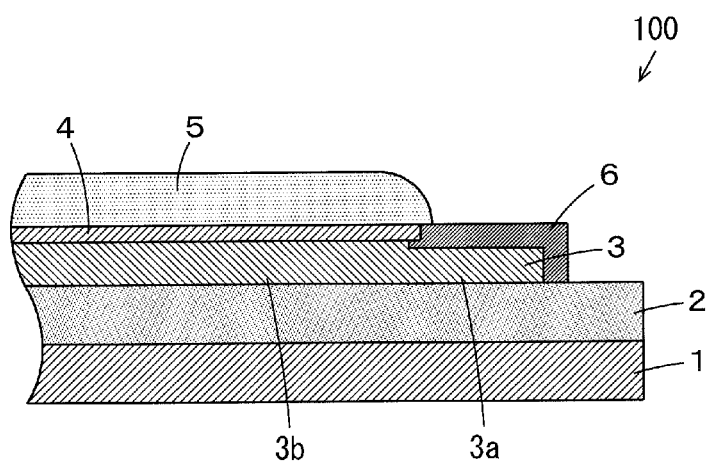

FIGS. 1(a) and 1(b) are a plan view and a cross sectional view of the printed circuit board according to the present embodiment. A cross section of FIG. 1(b) corresponds to a cross section taken along the line A-A in FIG. 1(a).

As shown in FIGS. 1(a) and 1(b), in the printed circuit board 100 according to the present embodiment, a base insulating layer 2 made of photosensitive polyimide, for example, is formed on a metal substrate 1 made of a stainless steel, for example. A plurality of strip-shaped conductor traces 3 made of copper, for example, are formed on the base insulating layer 2.

Hereinafter, a tip end of each conductor trace 3 is referred to as a terminal portion 3a, and a portion of each conductor trace 3 except for the terminal portion 3a is referred to as a wiring portion 3b.

A terminal cover layer 6 made of gold, for example, is formed to cover the surface of each terminal portion 3a. A wiring cover layer 4 made of nickel, for example, is formed to cover the surface of each wiring portion 3b. A cover insulating layer 5 made of polyimide, for example, is formed on the base insulating layer 2 to cover the wiring portions 3b of the plurality of conductor traces 3 and the plurality of wiring cover layers 4. In this case, the wiring cover layer 4 is provided between each wiring portion 3b and the cover insulating layer 5, so that the copper migration of each wiring portion 3b is prevented, and the adhesion between each wiring portion 3b and the cover insulating layer 5 is improved.

Figure 2:
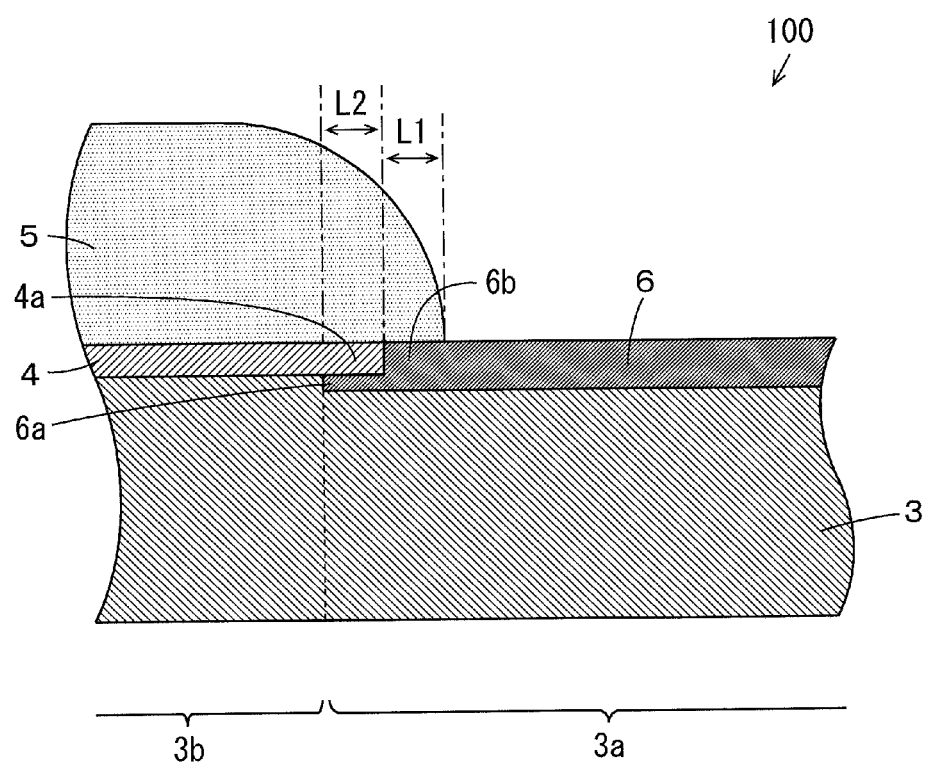
FIG. 2 is an enlarged cross sectional view showing surroundings of a boundary between a terminal portion and a wiring portion, of a conductor trace.
Figure 3:
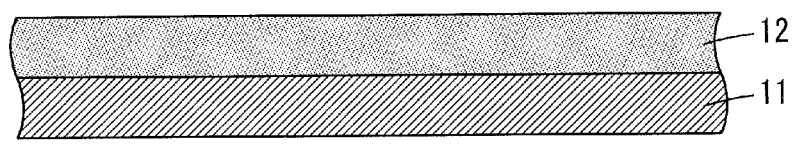
FIGS. 3(a) to 3(c) are cross sectional views showing manufacturing steps of the printed circuit board.
Figure 3:
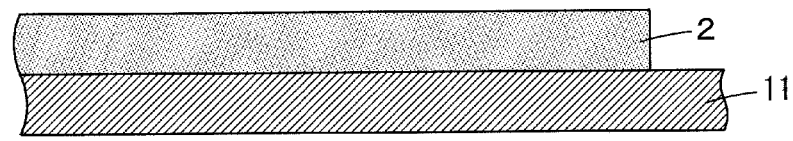
Figure 3:
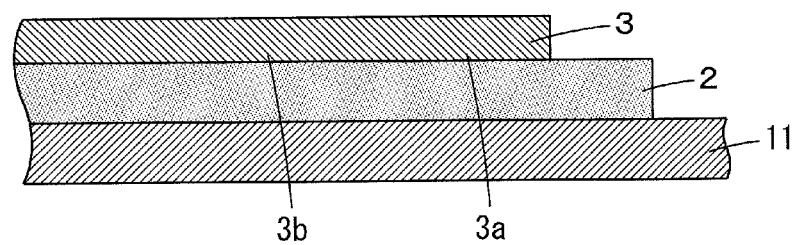
Figure 4:
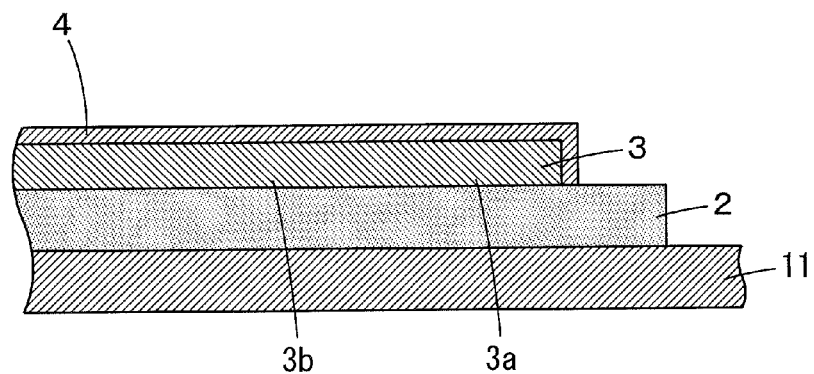
FIGS. 4(a) to 4(c) are cross sectional views showing the manufacturing steps of the printed circuit board.
Figure 4:
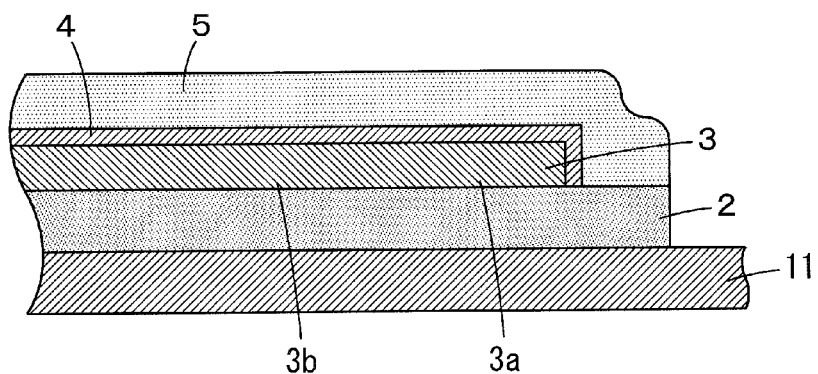
Figure 4:
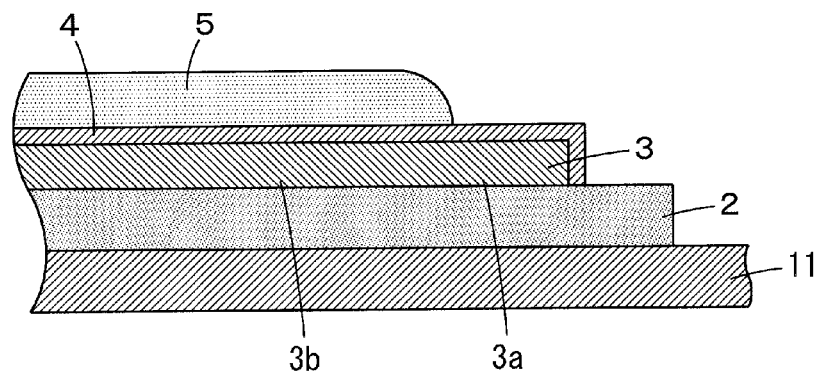
Figure 5:
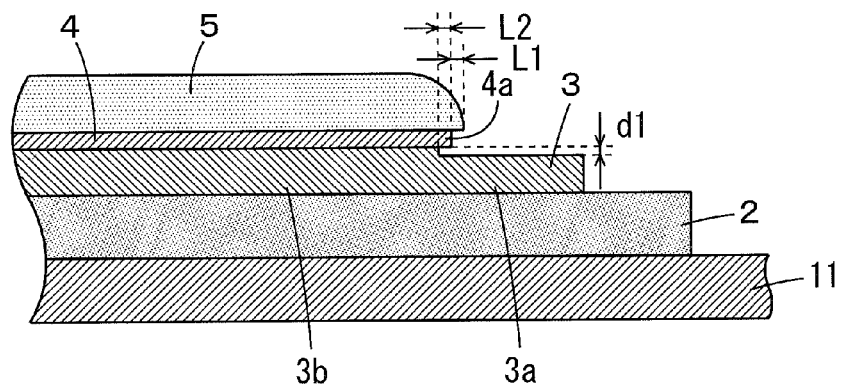
FIGS. 5(a) to 5(c) are cross sectional views showing the manufacturing steps of the printed circuit board.
Figure 5:
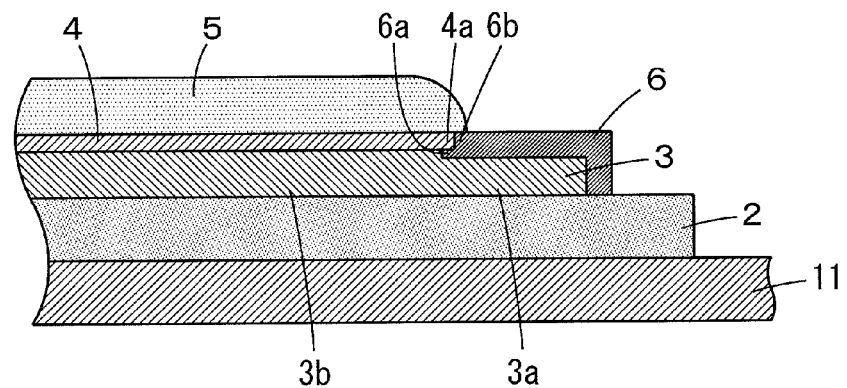
Figure 5:
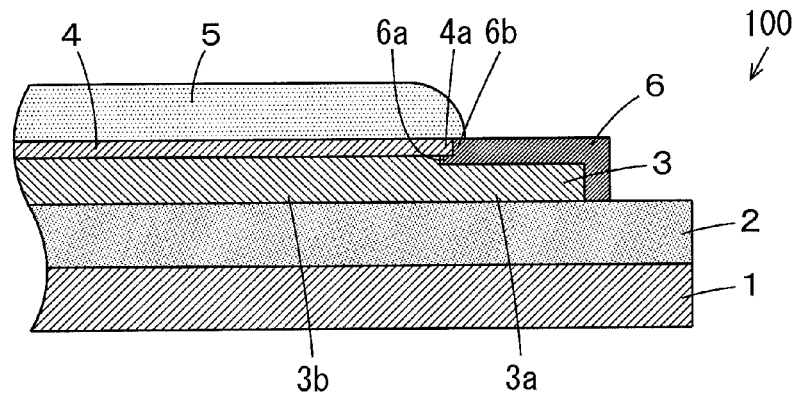

FIG. 2 is an enlarged cross sectional view showing the surroundings of the boundary between the terminal portion 3a and the wiring portion 3b, of the conductor trace 3. Note that, the metal substrate 1 and the base insulating layer 2 are not shown in FIG. 2. As shown in FIG. 2, the thickness of the terminal portion 3a of the conductor trace 3 is set to be smaller than the thickness of the wiring portion 3b.

The wiring cover layer 4 is formed to cover the wiring portion 3b under the cover insulating layer 5 except for a region that has a predetermined length L1 and extends inward from the end of the cover insulating layer 5. Further, the wiring cover layer 4 has a projection 4a. The projection 4a projects from the upper surface of the wiring portion 3b to a position above the terminal portion 3a by a predetermined length L2. Thus, a gap is formed between the lower surface of the projection 4a and the upper surface of the terminal portion 3a with the terminal cover layer 6 not being formed.

The terminal cover layer 6 is formed to fill the gap between the lower surface of the projection 4a and the upper surface of the terminal portion 3a, and a gap between the lower surface of the end of the cover insulating layer 5 and the upper surface of the terminal portion 3a, and to cover the terminal portion 3a. Thus, the terminal cover layer 6 is formed to adhere to the lower surface and the end surface of the projection 4a, and the upper surface of the terminal portion 3a. Here, the end surface of the projection 4a refers to a surface of the projection 4a vertical to a direction in which the conductor trace 3 extends.

A portion of the terminal cover layer 6 formed between the lower surface of the projection 4a and the upper surface of the terminal portion 3a is referred to as a projection 6a, and a portion of the terminal cover layer 6 formed between the lower surface at the end of the cover insulating layer 5 and the upper surface of the terminal portion 3a is referred to as an insert portion 6b. The lower surface of the projection 6a of the terminal cover layer 6 and the lower surface of the insert portion 6b are formed on a common surface (the upper surface of the terminal portion 3a).

(2) Manufacturing Method of Printed Circuit Board

Next, the manufacturing method of the printed circuit board 100 of FIGS. 1(a), 1(b) and 2 will be described. FIGS. 3(a) to 5(c) are cross sectional views showing the manufacturing steps of the printed circuit board 100.

As shown in FIG. 3(a), a two-layer base material made of a metal layer 11 and an insulating layer 12 is first prepared. The metal layer 11 is made of a stainless steel, for example. The insulating layer 12 is made of photosensitive polyimide, for example.

Another material such as aluminum may be used instead of a stainless steel as the material for the metal layer 11. The metal layer 11 has a thickness of not less than 5 μm and not more than 50 μm, for example, and preferably has a thickness of not less than 10 μm and not more than 30 μm.

Another photosensitive resin material such as photosensitive epoxy may be used instead of photosensitive polyimide as the material for the insulating layer 12. The insulating layer 12 has a thickness of not less than 1 μm and not more than 50 μm, for example, and preferably has a thickness of not less than 3 μm and not more than 20 μm.

Next, as shown in FIG. 3(b), an exposure process, a development process and a heat curing process are performed on the insulating layer 12, whereby the base insulating layer 2 in a predetermined shape is formed. The base insulating layer 2 in the predetermined shape may be formed of the insulating layer 12 using another method such as etching. In that case, a resin material such as polyimide or epoxy that is not photosensitive may be used as the material for the insulating layer 12.

Next, as shown in FIG. 3(c), a conductor trace 3 that includes the terminal portion 3a and the wiring portion 3b is formed on the base insulating layer 2 using a subtractive method, a semi-additive method or the like.

As the material for the conductor trace 3, another metal such as gold or aluminum may be used, and an alloy such as a copper alloy or an aluminum alloy may be used, instead of copper. The conductor trace 3 has a thickness of not less than 3 μm and not more than 50 μm, for example, and preferably has a thickness of not less than 3 μm and not more than 20 μm.

Next, as shown in FIG. 4(a), the wiring cover layer 4 made of nickel, for example, is formed by electroless plating to cover the surface of the conductor trace 3. In this case, a plating resist is formed at a portion of the base insulating layer 2 on which the conductor trace 3 is not formed, and the electroless plating is selectively formed at the surface of the conductor trace 3. Thereafter, the plating resist is removed.

As the material for the wiring cover layer 4, another metal such as tin may be used, and an alloy such as tin-copper, tin-bismuth or tin-silver may be used, instead of nickel. The wiring cover layer 4 has a thickness of not less than 0.01 μm and not more than 1 μm, for example, and preferably has a thickness of not less than 0.05 μm and not more than 0.2 μm. In a case in which the wiring cover layer 4 has a thickness of not less than 0.01 μm, the copper migration can be efficiently prevented. Further, in a case in which the wiring cover layer 4 has a thickness of not more than 1 μm, the below-mentioned etching of the wiring cover layer 4 can be performed in a short period of time.

Next, as shown in FIG. 4(b), the cover insulating layer 5 made of photosensitive polyimide, for example, is formed on the base insulating layer 2 to cover the conductor trace 3 and the wiring cover layer 4.

Another photosensitive resin material such as photosensitive epoxy may be used instead of photosensitive polyimide as the material for the cover insulating layer 5. The cover insulating layer 5 has a thickness of not less than 1 μm and not more than 50 μm, for example, and preferably has a thickness of not less than 2 μm and not more than 10 μm.

Next, as shown in FIG. 4(c), the exposure process, the development process and the heat curing process are performed on the cover insulating layer 5, whereby the cover insulating layer 5 is formed into a predetermined shape. In the present example, the heat curing process is performed on the cover insulating layer 5 for two hours at a temperature 385° C., for example.

Thus, a portion of the wiring cover layer 4 formed on the terminal portion 3a of the conductor trace 3 is exposed. The cover insulating layer 5 may be formed into a predetermined shape using another method such as etching. In that case, a resin material that is not photosensitive such as polyimide or epoxy may be used as the material for the cover insulating layer 5.

Next, as shown in FIG. 5(a), part of the wiring cover layer 4 and a portion of the terminal portion 3a are etched. Thus, a portion of the wiring cover layer 4 exposed from the cover insulating layer 5 and a portion of the wiring cover layer 4 that overlaps with a region that has the length L1 and extends inward from the end of the cover insulating layer 5 are removed, and the projection 4a is formed. Further, a portion of the terminal portion 3a exposed from the wiring cover layer 4 and a portion of the terminal portion 3a that overlaps with a region that has the length L2 and extends inward from the end of the projection 4a are removed.

The terminal portion 3a is reduced only by the thickness d1, so that the thickness of the terminal portion 3a is smaller than the thickness of the wiring portion 3b by the thickness d1. Further, the end of the projection 4a having the length L2 projects from the upper surface of the wiring portion 3b to a position above the terminal portion 3a.

Next, as shown in FIG. 5(b), the terminal cover layer 6 made of gold, for example, is formed by electrolytic plating to cover the lower surface and the end surface of the projection 4a and the upper surface of the terminal portion 3a. Thus, the projection 6a is formed between the lower surface of the projection 4a and the upper surface of the terminal portion 3a, and the insert portion 6b is formed between the lower surface of the end of the cover insulating layer 5 and the upper surface of the terminal portion 3a.

Another metal such as palladium having a high corrosion resistance may be used as the material for the terminal cover layer 6 instead of gold. The terminal cover layer 6 has a thickness of not less than 0.1 μm and not more than 10 μm, for example, and preferably has a thickness of not less than 0.5 μm and not more than 5 μm.

Then, as shown in FIG. 5(c), the metal layer 11 is etched, so that the metal substrate 1 in a predetermined shape is formed. Thus, the printed circuit board 100 is completed.

In the step of FIG. 5(a), an etchant is sprayed at a portion of the wiring cover layer 4 exposed from the cover insulating layer 5. A chemical liquid having a higher dissolution rate of the material for the conductor trace 3 than the dissolution rate of the material for the wiring cover layer 4 is used as the etchant. The chemical liquid having the same dissolution rate of the material for the wiring cover layer 4 as the dissolution rate of the material for the conductor trace 3 may be used as the etchant.

The etchant used for etching the wiring cover layer 4 normally includes a copper inhibiter (a copper corrosion inhibiter). Here, a component of the copper inhibiter inhibits copper from dissolving (corroding) in etching. In the present example, a nitric acid/hydrogen peroxide mixture that does not include the component of the copper inhibiter is used as the etchant. Thus, the dissolution rate of the conductor trace 3 can be easily increased to be higher than the dissolution rate of the wiring cover layer 4 in etching.

In this case, a portion of the wiring cover layer 4 at which the etchant is not directly sprayed hardly dissolves. That is, the portion of the wiring cover layer 4 under the cover insulating layer 5 hardly dissolves, and only the portion of the wiring cover layer 4 that overlaps with a region that has the length L1 and extends inward from the end of the cover insulating layer 5 dissolves.

On the other hand, the conductor trace 3 relatively easily dissolves due to the infiltration of the etchant. Thus, the portion of the conductor trace 3 exposed from the wiring cover layer 4 and the portion of the conductor trace 3 that overlaps with a region that has the length L2 and extends inward from the end of the projection 4a are reduced only by the thickness d1.

The lengths L1, L2 and the thickness d1 can be adjusted by an etching time period. The length L1 is not more than 1 μm, for example, and is preferably not more than 0.5 μm. In a case in which the length L1 is not more than 1 μm, a residue of the chemical liquid below the cover insulating layer 5 and the discoloration of the conductor trace 3 can be efficiently prevented. Further, the accumulation of moisture between the cover insulating layer 5 and the terminal cover layer 6 can be efficiently prevented. As a result, the long-term reliability of the printed circuit board 100 can be improved.

The length L2 is not more than 1 μm, for example, and preferably is not more than 0.5 μm. In a case in which the length L2 is not more than 1 μm, a residue of the chemical liquid below the wiring cover layer 4 and the discoloration of the conductor trace 3 can be efficiently prevented.

The thickness d1 is not less than 0.5 μm and not more than 2 μm, for example, and is preferably not less than 0.5 μm and not more than 1 μm. In a case in which the thickness d1 is not less than 0.5 μm, the dissolved wiring cover layer 4 below the cover insulating layer 5 can be efficiently removed. Further, in a case in which the thickness d1 is not more than 1 μm, a residue of the chemical liquid below the wiring cover layer 4 and the discoloration of the conductor trace 3 can be efficiently prevented.

(3) Effects

In the present embodiment, the thickness of the terminal portion 3a is smaller than the thickness of the wiring portion 3b, and the difference between the thickness of the terminal portion 3a and the thickness of the wiring portion 3b is not more than 2 μm. The end surface of the projection 4a of the wiring cover layer 4 is positioned at an inner side than the end of the cover insulating layer 5 only by the length L1, and the projection 4a projects from the upper surface of the wiring portion 3b to a position above the terminal portion 3a by the length L2.

The insert portion 6b of the terminal cover layer 6 is formed between the upper surface of the terminal portion 3a and the lower surface of the end of the cover insulating layer 5. The projection 6a of the terminal cover layer 6 is formed between the upper surface of the terminal portion 3a and the lower surface of the projection 4a. The upper surface of the insert portion 6b and the lower surface of the end of the cover insulating layer 5 come into contact with each other, the end surface of the insert portion 6b and the end surface of the projection 4a come into contact with each other, and the upper surface of the projection 6a and the lower surface of the projection 4a come into contact with each other.

Even in a case in which the chemical liquid is used in the manufacturing steps of the printed circuit board 100, this configuration prevents the chemical liquid from infiltrating between the upper surface of the insert portion 6b and the lower surface of the end of the cover insulating layer 5.

Further, the chemical liquid is also prevented from infiltrating between the end surface of the insert portion 6b and the end surface of the projection 4a, and the upper surface of the projection 6a and the lower surface of the projection 4a.

Therefore, it is not necessary to increase the thickness of the terminal cover layer 6 in order to prevent an occurrence of a residue of the chemical liquid. Thus, it is possible to prevent a corrosion of the terminal portion 3a without increasing the thickness of the terminal cover layer 6. Further, a manufacturing cost of the printed circuit board 100 can be reduced.

Further, a process in which the projection 4a is formed at the wiring cover layer 4 by one-time etching, and a process in which the thickness of the terminal portion 3a is reduced to be smaller than the thickness of the wiring portion 3b can be simultaneously performed. Thus, the printed circuit board 100 can be efficiently manufactured.

(4) Other Embodiments (a) While the metal substrate 1 is provided under the base insulating layer 2 in the above-mentioned embodiment, the invention is not limited to this. The metal substrate 1 does not have to be provided under the base insulating layer 2.

(b) While the portion of the wiring cover layer 4 and the portion of the terminal portion 3a are removed by selective etching using a wet-etching method in the above-mentioned embodiment, the invention is not limited to this. The portion of the wiring cover layer 4 and the portion of the terminal portion 3a may be removed by the selective etching using a dry-etching method.

Further, the portion of the wiring cover layer 4 and the portion of the terminal portion 3a may be removed by another method such as laser processing technology.

(5) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the base insulating layer 2 is an example of a base insulating layer, the terminal portion 3a is an example of a terminal portion, the wiring portion 3b is an example of a wiring portion, the conductor trace 3 is an example of a conductor trace and the wiring cover layer 4 is an example of a wiring cover layer. The cover insulating layer 5 is an example of a cover insulating layer, the terminal cover layer 6 is an example of a terminal cover layer, the projections 4a, 6a are respectively examples of first and second projections, the insert portion 6b is an example of an insert portion and the printed circuit board 100 is an example of a printed circuit board. As each of various elements recited in the claims, various other elements having configurations or functions described in the claims can be also used.

(6) Inventive Examples

The printed circuit boards according to the inventive examples 1 to 3 and the comparative examples 1, 2 were fabricated based on the manufacturing method of FIGS. 3(a) to 5(c). A stainless steel was used as the material for the metal substrate, photosensitive polyimide was used as the material for the base insulating layer and copper was used as the material for the conductor trace. Further, nickel was used as the material for the wiring cover layer, photosensitive polyimide was used as the material for the cover insulating layer and gold was used for the material for the terminal cover layer.

Further, the thickness of the conductor trace before etching was set to 10 μm, the thickness of the wiring cover layer was set to 0.1 μm, the thickness of the cover insulating layer was set to 5 μm and the thickness of the terminal cover layer was set to 1.5 μm.

In the inventive example 1, in the step of FIG. 5(a), a nitric acid/hydrogen peroxide mixture was used as the etchant, and an etching time period was set to 30 seconds. Thus, the length L1 was 0.5 μm, the length L2 was 0.3 μm and the thickness d1 was 0.6 μm.

In the inventive example 2, in the step of FIG. 5(a), a nitric acid/hydrogen peroxide mixture was used as the etchant, and the etching time period was set to 75 seconds. Thus, the length L1 was 0.9 μm, the length L2 was 0.7 μm and the thickness d1 was 1.8 μm.

In the inventive example 3, in the step of FIG. 5(a), a nitric acid/hydrogen peroxide mixture was used as the etchant, and the etching time period was set to 18 seconds. Thus, the length L1 was 0.1 μm, the length L2 was 0.2 μm and the thickness d1 was 0.35 μm.

In the comparative example 1, in the step of FIG. 5(a), a sulfuric acid/hydrogen peroxide mixture was used as the etchant, and the etching time period was set to 60 seconds. Thus, the length L1 was set to 0.1 μm, the length L2 was set to 3.0 μm and the thickness d1 was 2.4 μm.

In the comparative example 2, in the step of FIG. 5(a), a permanganate-containing alkaline solution was used as the etchant, and the etching time period was set to 60 seconds. Thus, the length L1 was 2.0 μm, the length L2 was 0.4 μm and the thickness d1 was 2.1 μm.

A residue of the chemical liquid such as the etchant below the cover insulating layer of each printed circuit board according to the inventive examples 1 to 3 and the comparative examples 1, 2 was examined. The results of the examination are shown in Table 1.

TABLE 1

|  | LENGTH L1 [μm] | LENGTH L2 [μm] | THICKNESS d1 [μm] | PRESENCE OF RESIDUE OF CHEMICAL LIQUID |
|---|---|---|---|---|
| INVENTIVE EXAMPLE 1 | 0.5 | 0.3 | 0.6 | NO |
| INVENTIVE EXAMPLE 2 | 0.9 | 0.7 | 1.8 | NO |
| INVENTIVE EXAMPLE 3 | 0.1 | 0.2 | 0.35 | NO |
| COMPARATIVE EXAMPLE 1 | 0.1 | 3.0 | 2.4 | YES |
| COMPARATIVE EXAMPLE 2 | 2.0 | 0.4 | 2.1 | YES |

As shown in Table 1, in each printed circuit board according to the inventive examples 1 to 3, a residue of the chemical liquid did not occur below the cover insulating layer. On the other hand, in each printed circuit board according to the comparative examples 1, 2, a residue of the chemical liquid occurred at the cover insulating layer.

From the results of comparison among the inventive examples 1 to 3 and the comparative examples 1, 2, it was confirmed that a residue of the chemical liquid below the cover insulating layer can be reliably prevented in a case in which the length L1 is not more than 1 μm, the length L2 is not more than 1 μm and the thickness d1 is not more than 2 μm. On the other hand, it was confirmed that a residue of the chemical liquid can occur below the cover insulating layer in a case in which the length L1 exceeds 1 μm, the length L2 exceeds 1 μm or the thickness d1 exceeds 2 μm.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

I claim:

1. A printed circuit board comprising:
a base insulating layer;
a conductor trace that is formed on the base insulating layer and has a terminal portion and a wiring portion;
a wiring cover layer formed on the wiring portion of the conductor trace;
a cover insulating layer formed on the base insulating layer to cover the wiring cover layer; and
a terminal cover layer formed to cover the terminal portion of the conductor trace, wherein
the terminal portion has a thickness smaller than a thickness of the wiring portion, and a difference between the thickness of the terminal portion and the thickness of the wiring portion is not more than 2 μm,
the wiring cover layer has a first projection that projects from an upper surface of the wiring portion to a position above the terminal portion, and an end surface of the first projection is positioned at an inner side than an end of the cover insulating layer,
the terminal cover layer has an insert portion formed between an upper surface of the terminal portion and a lower surface of the end of the cover insulating layer, and a second projection formed between the upper surface of the terminal portion and a lower surface of the first projection, and
the terminal cover layer is formed such that an upper surface of the insert portion and the lower surface of the end of the cover insulating layer come into contact with each other, an end surface of the insert portion and the end surface of the first projection come into contact with each other and an upper surface of the second projection and the lower surface of the first projection come into contact with each other.

2. The printed circuit board according to claim 1, wherein the insert portion has a length of not more than 1 μm in a direction directed inward from the end of the cover insulating layer.

3. The printed circuit board according to claim 1, wherein the second projection has a length of not more than 1 μm in a direction directed inward from the end of the cover insulating layer.

4. The printed circuit board according to claim 1, wherein a difference between the thickness of the terminal portion and the thickness of the wiring portion is not more than 1 μm.

5. The printed circuit board according to claim 1, wherein the wiring cover layer has a thickness of not less than 0.01 μm and not more than 1 μm.

6. A method of manufacturing a printed circuit board comprising the steps of:
forming a conductor trace that has a terminal portion and a wiring portion on a base insulating layer;
forming a wiring cover layer on the wiring portion of the conductor trace;
forming a cover insulating layer on the base insulating layer to cover the wiring cover layer; and p1 forming a terminal cover layer to cover the terminal portion of the conductor trace, wherein the terminal portion has a thickness smaller than a thickness of the wiring portion, and a difference between the thickness of the terminal portion and the thickness of the wiring portion is not more than 2 μm,
the step of forming the wiring cover layer includes processing the wiring cover layer such that an end of the wiring cover layer projects from an upper surface of the wiring portion to a position above the terminal portion as a first projection, and an end surface of the first projection is positioned at an inner side than an end of the cover insulating layer, and
the step of forming the terminal cover layer includes forming the terminal cover layer such that part of the terminal cover layer is formed between an upper surface of the terminal portion and a lower surface of an end of the cover insulating layer as an insert portion, another part of the terminal cover layer is formed between the upper surface of the terminal portion and a lower surface of the first projection as a second projection, the upper surface of the insert portion and the lower surface of the end of the cover insulating layer come into contact with each other, an end surface of the insert portion and the end surface of the first projection come into contact with each other, and an upper surface of the second projection and the lower surface of the first projection come into contact with each other.

7. The method of manufacturing the printed circuit board according to claim 6, wherein
processing the wiring cover layer includes
forming the wiring cover layer to cover the wiring portion and the terminal portion, and
removing a portion of the wiring cover layer exposed from the cover insulating layer and a portion of the wiring cover layer that overlaps with a region that has a predetermined length and extends in a direction directed inward from the end of the cover insulating layer, and reducing the thickness of the terminal portion that overlaps with a region that has a predetermined length and extends in a direction directed inward from the end of the remaining wiring cover layer only by not more than 2 µm.

8. The method of manufacturing the printed circuit board according to claim 7, wherein
the removal of the wiring cover layer and the reduction of the thickness of the terminal portion is performed by selective etching in which an etching rate for the terminal portion is higher than an etching rate for the wiring cover layer, or equal to the etching rate for the wiring cover layer.

9. The method of manufacturing the printed circuit board according to claim 8, wherein
the selective etching is performed using an etchant in which a dissolution rate of a material for the terminal portion is higher than a dissolution rate of a material for the wiring cover layer, or equal to the dissolution rate of the material for the wiring cover layer.

10. The method of manufacturing the printed circuit board according to claim 9, wherein
the wiring cover layer includes nickel, the wiring portion and the terminal portion include copper and the etchant includes a nitric acid/hydrogen peroxide mixture.

11. The method of manufacturing the printed circuit board according to claim 10, wherein
a copper inhibitor component that inhibits a corrosion of copper is removed from the etchant.

* * * * *